United States Patent
Blanquart

(10) Patent No.: US 12,428,728 B2
(45) Date of Patent: Sep. 30, 2025

(54) TOPOLOGY-SELECTIVE DEPOSITION METHOD AND STRUCTURE FORMED USING SAME

(71) Applicant: ASM IP Holding B.V., Almere (NL)

(72) Inventor: Timothee Blanquart, Oud-Heverlee (BE)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 17/902,957

(22) Filed: Sep. 5, 2022

(65) Prior Publication Data

US 2023/0070199 A1   Mar. 9, 2023

Related U.S. Application Data

(60) Provisional application No. 63/241,620, filed on Sep. 8, 2021.

(51) Int. Cl.
| | | |
|---|---|---|
| C23C 16/04 | (2006.01) | |
| C23C 16/36 | (2006.01) | |
| C23C 16/455 | (2006.01) | |
| C23C 16/56 | (2006.01) | |

(52) U.S. Cl.
CPC ...... *C23C 16/45536* (2013.01); *C23C 16/045* (2013.01); *C23C 16/36* (2013.01); *C23C 16/45553* (2013.01); *C23C 16/56* (2013.01)

(58) Field of Classification Search
CPC . C23C 16/45536; C23C 16/045; C23C 16/36; C23C 16/45553; C23C 16/56; C23C 16/45523; C23C 16/5096; C23C 16/515; C23C 16/45542; H01L 21/02274; H01L 21/0228; H01L 21/28556; H01L 21/31138; H01L 21/32135; H01L 21/31116

See application file for complete search history.

(56) References Cited

U.S. PATENT DOCUMENTS

| | | | |
|---|---|---|---|
| 9,984,869 B1 | 5/2018 | Blanquart | |
| 2013/0260561 A1* | 10/2013 | Ranjan | H01L 29/66795 438/696 |
| 2014/0017414 A1* | 1/2014 | Fukazawa | C23C 16/45542 427/576 |
| 2014/0141625 A1* | 5/2014 | Fukazawa | H01L 21/02167 438/791 |
| 2014/0162461 A1* | 6/2014 | Kim | H01L 21/31144 438/703 |
| 2015/0093908 A1* | 4/2015 | Reddy | H01L 21/02115 438/758 |
| 2016/0085153 A1* | 3/2016 | Meade | G02B 6/136 430/311 |
| 2017/0221756 A1* | 8/2017 | Tsutsumi | H10B 43/27 |
| 2017/0263438 A1* | 9/2017 | Li | H01L 21/31116 |
| 2017/0338109 A1* | 11/2017 | Lei | H01L 21/0234 |
| 2018/0108537 A1* | 4/2018 | Takahashi | H01L 21/31144 |
| 2018/0151346 A1 | 5/2018 | Blanquart | |
| 2018/0350587 A1* | 12/2018 | Jia | H01L 21/02205 |
| 2018/0374866 A1* | 12/2018 | Makala | H10B 43/10 |

(Continued)

*Primary Examiner* — Gordon Baldwin
*Assistant Examiner* — Christina D McClure
(74) *Attorney, Agent, or Firm* — Snell & Wilmer L.L.P.

(57) ABSTRACT

A topology-selective deposition method is disclosed. An exemplary method includes depositing a first layer of material overlying a gap or feature on a substrate surface, depositing a second layer of material overlying the first layer of material, and selectively removing the first layer of material.

16 Claims, 5 Drawing Sheets

(56) References Cited

U.S. PATENT DOCUMENTS

| | | | |
|---|---|---|---|
| 2019/0035677 A1* | 1/2019 | Chandhok | H01L 21/0337 |
| 2019/0096666 A1* | 3/2019 | Zhou | H01L 21/28123 |
| 2019/0348287 A1* | 11/2019 | Varghese | H01L 21/32155 |
| 2019/0385896 A1* | 12/2019 | Chiang | H01L 23/5226 |

* cited by examiner

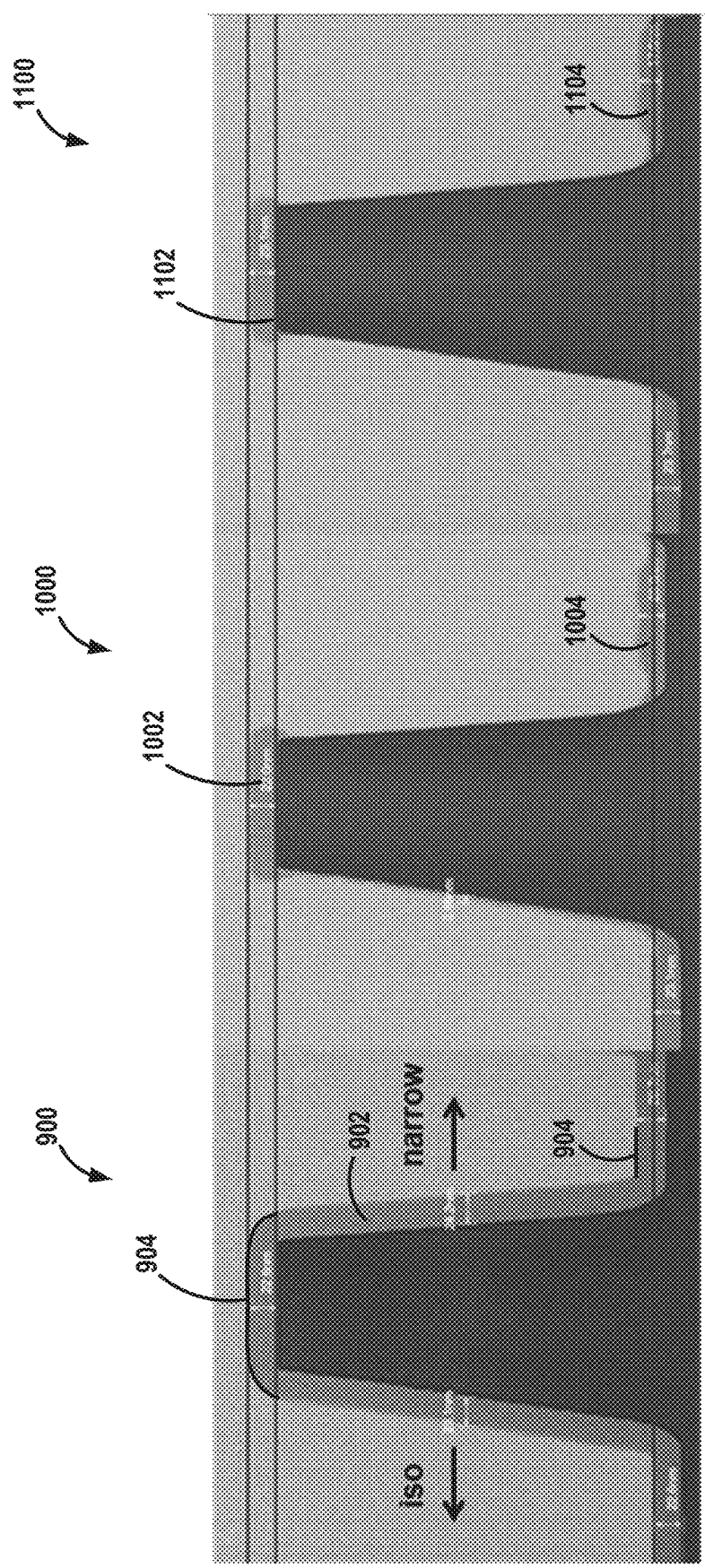

TOPOLOGY-SELECTIVE DEPOSITION METHOD AND STRUCTURE FORMED USING SAME

CROSS-REFERENCE TO RELATED APPLICATIONS

This application claims priority to U.S. Provisional Patent Application Ser. No. 63/241,620 filed Sep. 8, 2021, titled TOPOLOGY-SELECTIVE DEPOSITION METHOD AND STRUCTURE FORMED USING SAME, the disclosure of which is hereby incorporated by reference in its entirety.

FIELD OF INVENTION

The present disclosure generally relates to methods that include selective formation of material on a surface of a substrate. More particularly, the disclosure relates to methods of forming structures that include a topology-selectively deposited material.

BACKGROUND OF THE DISCLOSURE

During the formation of devices, such as semiconductor devices, it is often desirable to form patterned features on a surface of a substrate. Typically, to form patterned features, a layer of material (e.g., silicon nitride) is deposited, the deposited layer is then patterned using, for example, photolithography, and then the film is etched to form features including the material.

As device features continue to decrease in size, it becomes increasingly difficult to pattern and etch silicon nitride and other material layers to form features of desired dimensions. And, lithography and etch steps can increase costs associated with device manufacturing and increase an amount of time required for device fabrication. Furthermore, in some cases, it may be desirable to form material overlying features topology-selectively (topo-selectively). For example, it may be desirable to form topo-selective material for use as an etch stop in various applications. In such cases, typical deposition, pattern, and etch techniques may not be suitable—particularly as a size of the features continues to decrease.

Accordingly, improved methods for topo-selective formation of materials are desired.

SUMMARY OF THE DISCLOSURE

Various embodiments of the present disclosure relate to topology-selective deposition methods, to structures formed using the methods, and to systems for performing the methods. While the ways in which various embodiments of the present disclosure address drawbacks of prior methods and structures are discussed in more detail below, in general, embodiments of the disclosure provide improved methods of topo-selective methods that include depositing a first layer of material, depositing a second layer of material, and selectively etching the first layer of material, such that portions of the second layer of material remain on topo-selective surfaces after the step of selectively etching.

In accordance with at least one embodiment of the disclosure, a topology-selective deposition method includes providing a substrate comprising patterned structures on a surface of the substrate, the patterned structures comprising a gap, the gap comprising a proximal surface, a distal surface, and a sidewall; depositing a first layer of material on the patterned structures, thereby conformally forming a first layer on the proximal surface, the distal surface, and the sidewall; depositing a second layer of material overlying the first layer of material, wherein the second layer is selectively formed on at least one of the proximal surface and the distal surface relative to the sidewall; and selectively etching the first layer of material relative to the second layer of material to thereby form features comprising topology-selective deposited material. In accordance with examples of the disclosure, multiple steps of a method are performed within a single reaction chamber (e.g., within the same reaction space). For example, two or more of the steps of depositing the first layer of material, depositing the second layer, and selectively etching can be performed within the same reaction chamber. The step of depositing the first layer and/or the step of depositing the second layer can include a cyclical deposition process, such as a plasma-enhanced cyclical deposition process. In accordance with further examples of the disclosure, a method can additionally include a step of treating the second layer of material. Exemplary treating steps can include one or more of oxidizing, nitriding, and carbonizing the second layer of material. In some cases, the second layer includes carbon. In accordance with yet further examples, the second layer of material may form as a closed layer overlying one or more of the proximal surface and the distal surface and may include pinholes and/or isolated islands on the sidewall. Thus one or more of (1) a number of pinholes in the second layer can be higher overlying the sidewall relative to a number of pinholes of the second layer overlying one or more of the proximal surface and the distal surface and/or (2) the second layer can form islands on the sidewall and a continuous layer overlying one or more of the proximal surface and the distal surface. In accordance with yet additional examples, a (e.g., silicon) precursor used to form the first layer of material and a precursor used to form the second layer of material are the same. In accordance with further examples, a (e.g., oxidizing) reactant used to form the first layer of material and a (e.g., nitriding and/or carbonizing) reactant used to form the second layer of material are different.

In accordance with further examples of the disclosure, a topology-selective deposition method includes: providing a substrate within a reaction chamber, the substrate comprising patterned structures on a surface of the substrate, the patterned structures comprising a gap, the gap comprising a proximal surface, a distal surface, and a sidewall; depositing, within the reaction chamber, a first layer of material on the patterned structures, thereby conformally forming a first layer on the proximal surface, the distal surface, and the sidewall; depositing a second layer of material overlying the first layer of material within the reaction chamber, wherein a (e.g., thickness) conformality of the second layer overlying the proximal surface, the distal surface, and the sidewall is less than a conformality of the first layer of material overlying the proximal surface, the distal surface, and the sidewall; and selectively etching the first layer of material relative to the second layer within the reaction chamber. Exemplary (e.g., cyclical and/or plasma enhanced cyclical) processes, precursors, and reactants used to deposit the first layer of material, the second layer of material, and to selectively etch the first layer of material can be as described above and elsewhere herein.

In accordance with various methods described herein, a (e.g., wet) etch rate of the second layer overlying the sidewall is higher (e.g., 10, 25, 50 or more percent higher) than an etch rate of the second layer overlying the proximal surface and/or the distal surface. Additionally or alternatively a composition and/or a density of the second layer overlying the sidewall and the composition and/or density of the second layer overlying the proximal surface and/or the distal surface differ. The difference in composition and/or density can arise from, for example, varying types of ion and/or radical bombardment on the respective surface during a deposition process. The difference in composition, density, or continuity can give rise to a difference in etch rates on the respective surfaces.

In accordance with additional embodiments of the disclosure, a structure includes topo-selective deposited material. The topo-selective material can be deposited using a method as described herein.

In accordance with further examples of the disclosure, a system is provided. The system can be configured to perform a method as described herein and/or to form a structure as described herein.

For purposes of summarizing the invention and the advantages achieved over the prior art, certain objects and advantages of the invention may have been described herein. Of course, it is to be understood that not necessarily all such objects or advantages may be achieved in accordance with any particular embodiment. Thus, for example, those skilled in the art will recognize that the illustrative examples may be embodied or carried out in a manner that achieves or optimizes one advantage or group of advantages as taught or suggested herein, without necessarily achieving other objects or advantages as may be taught or suggested herein. These and other embodiments will become readily apparent to those skilled in the art from the following detailed description of certain embodiments having reference to the figures, the invention not being limited to any particular embodiment disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

FIGS. 9-11 illustrate scanning electron transmission images of structures formed in accordance with examples of the disclosure.

Figure 1:
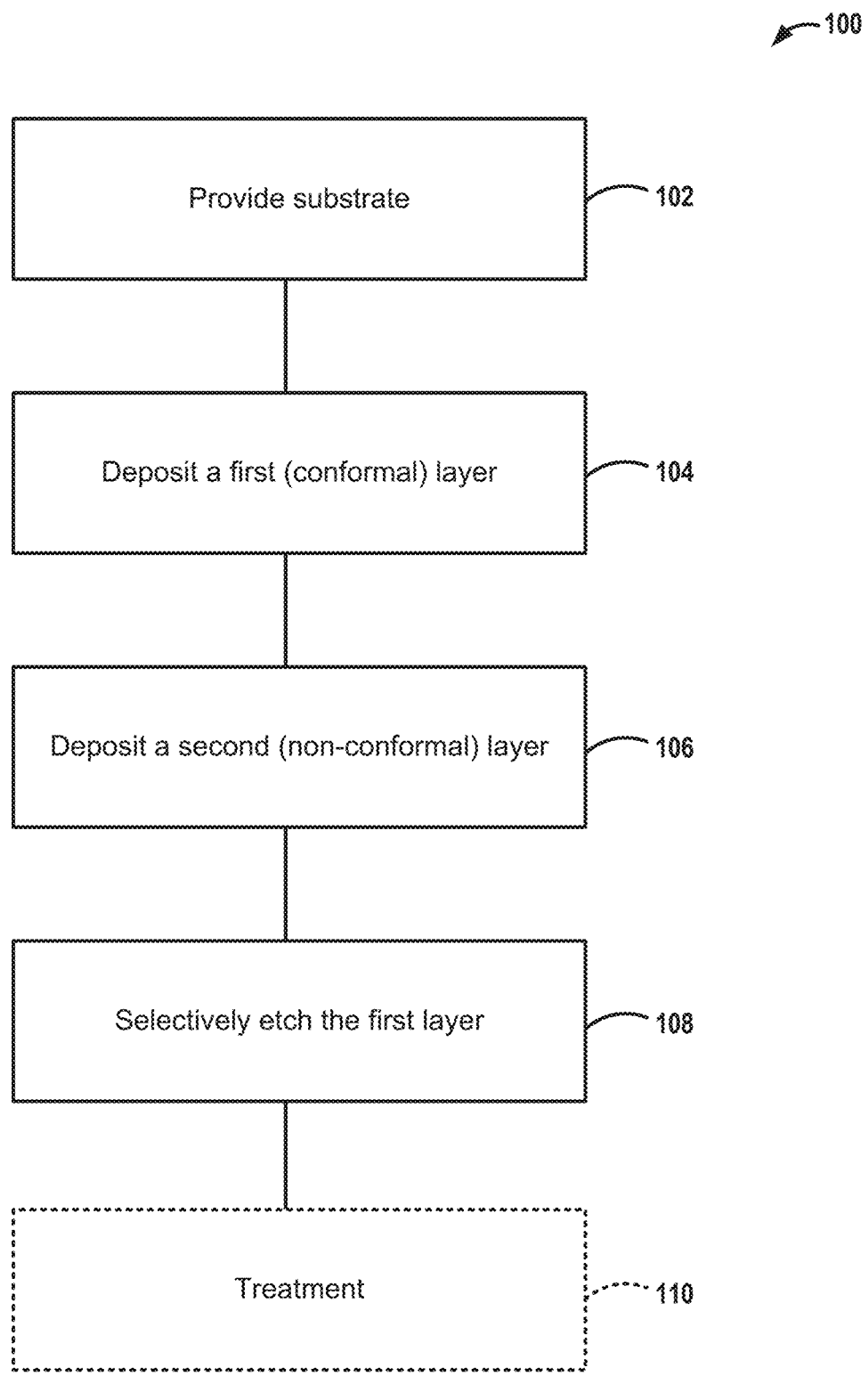
FIG. 1 illustrates a topology-selective deposition method in accordance with at least one embodiment of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to topology-selective deposition methods, structures formed using the methods, and systems that can be used to perform the methods and/or form the structures. As described in more detail below, exemplary methods can be used to form device structures suitable for forming electronic devices. For example, exemplary methods can be used to form features that include topology-selective deposited material suitable for use as, for example, an etch stop layer. Unless otherwise noted, examples of the disclosure are not necessarily limited to such applications.

In this disclosure, gas may include material that is a gas at normal temperature and pressure, a vaporized solid and/or a vaporized liquid, and may be constituted by a single gas or a mixture of gases, depending on the context. A gas other than the process gas, e.g., a gas introduced without passing through a gas distribution assembly, such as a showerhead, other gas distribution device, or the like, may be used for, e.g., sealing the reaction space, and may include a seal gas, such as a noble or other inert gas. The term inert gas refers to a gas that does not take part in a chemical reaction to an appreciable extent. In some cases, a noble gas can be a reactant. In some cases, terms precursor and reactant can be used interchangeably.

As used herein, the term substrate can refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as GaAs, and can include one or more layers overlying or underlying the bulk material. Further, the substrate can include various structures, such as recesses, lines, and the like formed within or on at least a portion of a layer of the substrate.

As used herein, the term cyclical deposition may refer to the sequential introduction of precursors/reactants into a reaction chamber to deposit a layer over a substrate and includes processing techniques such as atomic layer deposition and cyclical chemical vapor deposition.

As used herein, the term atomic layer deposition (ALD), and particularly plasma-enhanced ALD may refer to a vapor deposition process in which deposition cycles, typically a plurality of consecutive deposition cycles, are conducted in a process chamber. Generally, during each cycle, a precursor is chemisorbed to a deposition surface (e.g., active sites on the surface), forming about a monolayer or sub-monolayer of material that does not readily react with additional precursor (i.e., a self-limiting reaction). Thereafter, in some cases, a reactant or activated species formed using the reactant may subsequently be introduced into the process chamber for use in converting or reacting with the chemisorbed precursor to form the desired material on the deposition surface. Further, purging steps can also be utilized during each cycle to remove excess precursor from the process chamber and/or remove excess reactant and/or reaction byproducts from the process chamber after conversion of the chemisorbed precursor. The term atomic layer deposition, as used herein, is also meant to include processes designated by related terms, such as chemical vapor atomic layer deposition, atomic layer epitaxy (ALE), molecular beam epitaxy (MBE), gas source MBE, or organometallic MBE, and chemical beam epitaxy when performed with alternating pulses of precursor(s)/reactive gas(es), and purge (e.g., inert) gas(es).

As used herein, the term cyclical chemical vapor deposition may refer to any process wherein a substrate is sequentially exposed to two or more volatile precursors, which react and/or decompose on a substrate to produce a desired deposition. A plasma-enhanced cyclical chemical vapor deposition may refer to any process in which one or more of a reactant, and a precursor are exposed to a plasma (e.g., a remote plasma, a direct plasma, or an indirect plasma) during a deposition process. In these cases, a cycle can include pulsing one or more of the reactant, the precursor, and/or a plasma power.

In some embodiments, film refers to a layer extending in a direction perpendicular to a thickness direction to cover an entire target or concerned surface, or simply a layer covering a target or concerned surface. In some embodiments, layer refers to a structure having a certain thickness formed on a surface or a synonym of film or a non-film structure. A layer can be continuous or noncontinuous. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequences, and/or functions or purposes of the adjacent films or layers. The terms film and layer can be used interchangeably.

As used herein, the terms conformal or conformality can refer to a uniformity of property of a layer overlying a feature, such as a gap. A property can include, for example, film thickness, film density, (e.g., wet) etch rate of a film, continuity (e.g., continuous film or not), film composition, or the like. A film is considered conformal if a property varies across a feature or area by less than 25, 10, 5, 2, or 1 percent.

In this disclosure, continuously can refer to one or more of without breaking a vacuum, without interruption as a timeline, without any material intervening step, without changing treatment conditions, immediately thereafter, as a next step, or without an intervening discrete physical or chemical structure between two structures other than the two structures in some embodiments. For example, a reactant and/or a noble gas can be supplied continuously during two or more steps and/or deposition cycles of a method.

As used herein, the term purge may refer to a procedure in which an inert or substantially inert gas is provided to a reactor chamber in between pulses of other (e.g., reactant, precursor) gases and/or after a plasma power pulse. For example, a purge may be provided between a precursor pulse and a reactant pulse, thus avoiding or at least reducing gas phase interactions between the precursor and the reactant. It shall be understood that a purge can be effected either in time or in space, or both. For example, in the case of temporal purges, a purge step can be used, e.g., in the temporal sequence of providing a first precursor to a reactor chamber, providing a purge gas to the reactor chamber, and providing a second precursor to the reactor chamber, wherein the substrate on which a layer is deposited does not move. In the case of spatial purges, a purge step can take the form of moving a substrate from a first location to which a first precursor is supplied, through a purge gas curtain, to a second location to which a second precursor is supplied. In some cases, a reactant that is not excited by a plasma can be used to purge the reactor chamber.

As used herein, silicon oxide refers to a material that includes silicon and oxygen. Silicon oxide can be represented by the formula $SiO_2$. In some cases, the silicon oxide may not include stoichiometric silicon oxide. In some cases, the silicon oxide can include other elements, such as carbon, nitrogen, hydrogen, or the like.

As used herein, silicon nitride refers to a material that includes silicon and nitrogen. Silicon nitride can be represented by the formula $Si_3N_4$. In some cases, the silicon nitride may not include stoichiometric silicon nitride. In some cases, the silicon nitride can include other elements, such as carbon, hydrogen, or the like.

Silicon carbon nitride (SiCN) can refer to material that includes silicon, carbon, and nitrogen. As used herein, unless stated otherwise, SiCN is not intended to limit, restrict, or define the bonding or chemical state, for example, the oxidation state of any of Si, C, N, and/or any other element in the film. In some embodiments, SiCN thin films may comprise one or more elements in addition to Si, C, and N, such as H. In some embodiments, the SiCN films may comprise Si—C bonds and/or Si—N bonds. In some embodiments, the SiCN films may comprise Si—H bonds in addition to Si—C and/or Si—N bonds. In some embodiments, the SiCN films may comprise from about 0% to about 50% carbon on an atomic basis. In some embodiments, the SiCN films may comprise from about 0.1% to about 40%, from about 0.5% to about 30%, from about 1% to about 30%, or from about 5% to about 20% carbon on an atomic basis. In some embodiments, the SiCN films may comprise from about 0.1% to about 70% nitrogen on an atomic basis. In some embodiments, the SiCN films may comprise from about 10% to about 70%, from about 15% to about 50%, or from about 20% to about 40% nitrogen on an atomic basis. In some embodiments, the SiCN films may comprise about 0.1% to about 50% silicon on an atomic basis. In some embodiments, the SiCN films may comprise from about 10% to about 50%, from about 15% to about 40%, or from about 20% to about 35% silicon on an atomic basis. In some embodiments, the SiCN films may comprise from about 0.1% to about 40%, from about 0.5% to about 30%, from about 1% to about 30%, or from about 5% to about 20% hydrogen on an atomic basis. In some embodiments, the SiCN films may not comprise oxygen.

Silicon oxycarbide (SiOC) can refer to material that includes silicon, oxygen, and carbon. As used herein, unless stated otherwise, SiOC is not intended to limit, restrict, or define the bonding or chemical state, for example, the oxidation state of any of Si, O, C, and/or any other element in the film. In some embodiments, SiOC thin films may comprise one or more elements in addition to Si, O, and C, such as H or N. In some embodiments, the SiOC films may comprise Si—C bonds and/or Si—O bonds. In some embodiments, the SiOC films may comprise Si—C bonds and Si—O bonds and may not comprise Si—N bonds. In some embodiments, the SiOC films may comprise Si—H bonds in addition to Si—C and/or Si—O bonds. In some embodiments, the SiOC films may comprise more Si—O bonds than Si—C bonds, for example, a ratio of Si—O bonds to Si—C bonds may be from about 1:10 to about 10:1. In some embodiments, the SiOC films may comprise from about 0% to about 50% carbon on an atomic basis. In some embodiments, the SiOC films may comprise from about 0.1% to about 40%, from about 0.5% to about 30%, from about 1% to about 30%, or from about 5% to about 20% carbon on an atomic basis. In some embodiments, the SiOC films may comprise from about 0.1% to about 70% oxygen on an atomic basis. In some embodiments, the SiOC films may comprise from about 10% to about 70%, from about 15% to about 50%, or from about 20% to about 40% oxygen on an atomic basis. In some embodiments, the SiOC films may comprise about 0.1% to about 50% silicon on an atomic basis. In some embodiments, the SiOC films may comprise from about 10% to about 50%, from about 15% to about 40%, or from about 20% to about 35% silicon on an atomic basis. In some embodiments, the SiOC films may comprise from about 0.1% to about 40%, from about 0.5% to about 30%, from about 1% to about 30%, or from about 5% to about 20% hydrogen on an atomic basis. In some embodiments, the SiOC films may not comprise nitrogen. In some other embodiments, the SiOC films may comprise from about 0% to about 40% nitrogen on an atomic basis (at %). By way of particular examples, SiOC films can be or include a layer comprising SiOCN, such as SiOCNH.

As used herein, the term overlap can mean coinciding with respect to time and within a reaction chamber. For example, with regard to gas pulse periods, such as precursor pulse periods and reactant pulse periods, two or more gas pulse periods can overlap when gases from the respective pulse periods are within the reaction chamber or provided to the reaction chamber for a period of time.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments. Further, in this disclosure, the terms "including," "constituted by" and "having" can refer independently to "typically or broadly comprising," "comprising," "consisting essentially of," or "consisting of" in some embodiments. In accordance with aspects of the disclosure, any defined meanings of terms do not necessarily exclude ordinary and customary meanings of the terms.

Figure 2:
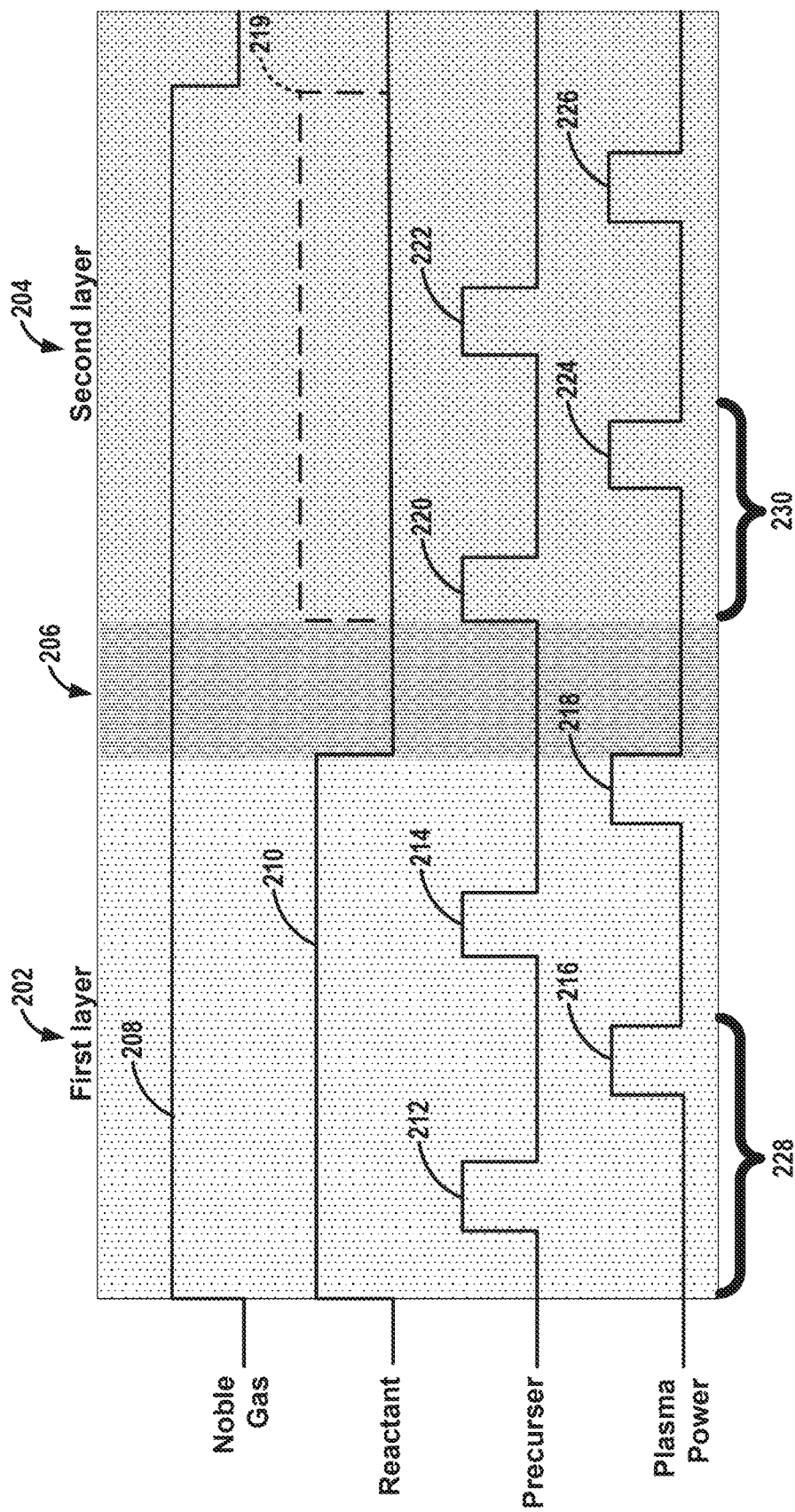
FIG. 2 illustrates a timing sequence suitable for use with the method illustrated in FIG. 1.

Turning now to the figures, FIG. 1 illustrates a topology-selective deposition method 100 in accordance with at least one embodiment of the disclosure. Method 100 includes the steps of providing a substrate (step 102), depositing a first layer of material (step 104), depositing a second layer of material (step 106), and selectively etching the first layer of material relative to the second layer of material (step 108). Method 100 also includes an optional treatment step (110). FIG. 2 illustrates a timing sequence suitable for use with steps 104 and 106 of method 100.

During step 102, a substrate is provided, e.g., into a reaction chamber of a reactor. In accordance with examples of the disclosure, the reaction chamber can form part of a cyclical deposition reactor, such as an atomic layer deposition (ALD) reactor, and particularly a plasma-enhanced ALD (PEALD) reactor. Various steps of method 100 can be performed within a single reaction chamber or can be performed in multiple reaction chambers, such as reaction chambers of a cluster tool. Optionally, a reactor including the reaction chamber can be provided with a heater to activate the reactions by elevating the temperature of one or more of the substrate, the reaction chamber wall, and/or the reactants/precursors.

Figure 3:
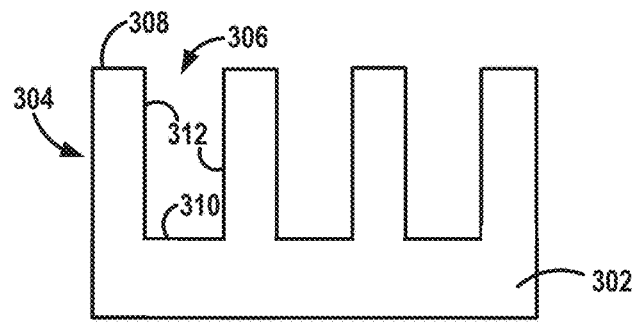
FIGS. 3-7 illustrate structures in accordance with examples of the disclosure.

An exemplary substrate 302 provided during step 102 is illustrated in FIG. 3. As illustrated, substrate 302 includes patterned structures 304 on a surface 306 of substrate 302. Patterned structures include a gap 306 comprising a proximal surface 308, a distal surface 310, and a sidewall 312. Gap 306 can be formed, for example, as a via, between lines or protrusions, or the like. Thus, in some cases, sidewall 310 can span a gap, and in other cases, a gap can include a plurality of sidewalls.

During step 102, the substrate can be brought to a desired temperature and pressure for step 104. By way of examples, a temperature (e.g., of a substrate or a substrate support) within a reaction chamber can be between about 25° C. and about 300° C. or about 300° C. and about 600° C. A pressure within the reaction chamber can be about 0.1 to about 10 or about 10 to about 760 Torr.

Figure 4:
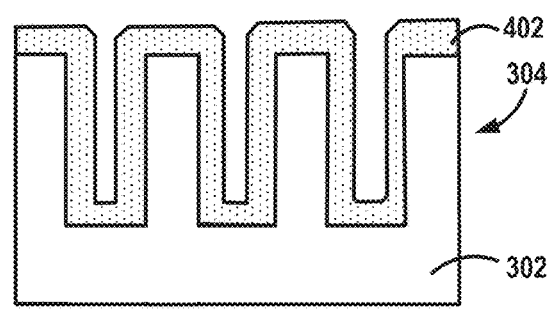

During step 104, a first layer of material 402 is deposited onto patterned structures, thereby conformally forming first layer 402 on proximal surface 308, distal surface 310, and sidewall 312. FIG. 4 illustrates a structure including first layer 402 conformally formed overlying gap 306.

First layer 402 can be or include, for example, an oxide or a nitride, such as silicon oxide, silicon nitride, aluminum nitride, titanium oxide, other metal oxide/nitride or other materials, such as amorphous silicon, polysilicon, organic layer (amorphous carbon, photoresist). In some cases, first layer 402 includes a metalloid, a post transition metal, and/or a transition metal—e.g., an oxide or nitride of such materials.

Depositing the first layer of material step 104 can include a first cyclical process that includes providing a first precursor and a first reactant to a reaction chamber (e.g., the reaction chamber used during step 102). Exemplary first precursors include one or more of a metalloid (e.g., silicon) and a metal. For example, the precursors can include a metal precursor, a silicon precursor, or both. Exemplary silicon precursors can be selected from the group consisting of aminosilanes, halogenated silanes, silanes (e.g., monosilane, disilane, trisilane), and silicon halides. The aminosilanes and halogenated silanes include, but are not limited to, $Si_2Cl_6$, $SiCl_2H_2$, $SiI_2H_2$, bisdiethylaminosilane, bisdimethylaminosilane, hexaethylaminodisilane, tetraethylaminosilane, tert-butylaminosilane, bistert-butylaminosilane, trimethylsilyldiethylamine, trimethylsilyldiethylamine, and bisdimethylaminodimethylsilane. Exemplary silicon halides include silicon tetraiodide ($SiI_4$), silicon tetrabromide ($SiBr_4$), silicon tetrachloride ($SiCl_4$), hexachlorodisilane ($Si_2Cl_6$), hexaiododisilane ($Si_2I_6$), octoiodotrisilane ($Si_3I_8$). Exemplary metal precursors can include one or more of Ti, W, Ta, Mn, Hf, Al, Zn, Sn and/or Ru. For example, a precursor for titanium oxide can be at least one compound selected from titanium alkoxide and alkylamino titanium, including $Ti(OR)_4$ wherein R is independently CxHy (x=0, 1, 2, 3, 4, or 5, y=2x+1), and each R can be different (e.g., $Ti(OCH_3)_2(OC_2H_5)(OC_3H_7)$); $Ti(NR_2)_4$ wherein R is independently CxHy (x=0, 1, 2, 3, 4, or 5, y=2x+1), and each R can be different (e.g., $Ti(N(CH_3)(C_2H_5))_4$). A precursor for a metal oxide other than titanium oxide can also be selected from any suitable compounds. Exemplary first reactants include an oxygen reactant (e.g., one or more of $O_2$, $O_3$, $H_2O$, and $H_2O_2$), $NH_3$, $N_2H_2$, $H_2$ and the like and mixture thereof. The first reactant(s) can be thermally and/or plasma activated.

By way of particular example, step 104 includes a plasma-enhanced cyclical deposition (e.g., plasma-enhanced ALD (PEALD)) process. In accordance with examples of the disclosure, at least one of the first precursor and the first reactant are exposed to a plasma to form first excited species.

With reference to FIG. 2, a plasma-enhanced cyclical deposition process 202 to deposit a first layer of material 402 can include providing a noble gas (e.g., argon) to the reaction chamber for a noble gas pulse 208, providing a first reactant to the reaction chamber for a first reactant pulse 210, providing a first precursor to the reaction chamber for one or more first precursor pulses 212, 214, and providing plasma power for one or more first plasma power pulses 216, 218. A first layer of material deposition cycle 228 can include first reactant pulse 210, first precursor pulse 212, and first plasma power pulse 216. As used herein, pulse means a period in which a gas (e.g., precursor, reactant, noble gas, and/or carrier gas) is flowed to a reaction chamber and/or a period in which power is applied (e.g., power to produce a plasma). A height and/or width of the illustrated pulse is not necessarily indicative of a particular amount or duration of a pulse.

Noble gas pulse 208 can be continuous through one or more deposition cycles 228 and/or steps 104/202, and/or steps 104 and 106. A flowrate of the noble gas can be between about 10 sccm and 10,000 sccm.

First reactant pulse 210 can be continuous through one or more deposition cycles 228 and/or steps 104/202, and/or steps 104 and 106. A flowrate of the first reactant can be between about 10 sccm and 10,000 sccm.

A duration of first precursor pulses 212, 214 can range from about 0.05 to about 5 seconds. A flowrate of the first reactant can be between about 10 sccm and 10,000 sccm.

A duration of one or more of the first plasma power periods 216, 218 can be greater than 0 and less than 0.5 seconds. A plasma power during first plasma power periods 216, 218 can be about 50 W/300 mm wafer to about 500 W/300 mm wafer.

After step 104, the reaction chamber can be purged. During a purge step, precursors and/or reactants can be exhausted from the reaction chamber by inert gases, a vacuum pressure and/or the substrate can be removed to another process area/reaction chamber. With reference to FIG. 2, sequence portion 206 can be used to stabilize gases and to purge the reaction chamber. As illustrated, the noble gas can continue to flow during sequence portion 206, while the flow of the precursor and the reactant are ceased.

Figure 5:
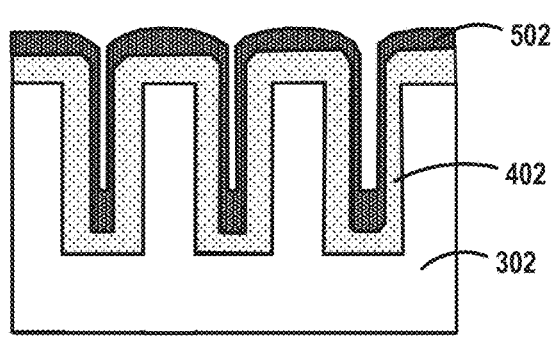

Returning again to FIG. 1, step 106 includes depositing a second layer of material 502 (illustrated in FIG. 5) overlying a first layer of material 402. Step 106 includes depositing second layer of material 502 in a non-conformal manner overlying gaps 306, such that, for example, second layer 502 is selectively formed on at least one of the proximal surface 308 and distal surface 310 relative to the sidewall 312. In this contexts and as illustrated, selectively formed means a thickness of layer 502 is greater over proximal surface 308 and distal surface 310, relative to sidewall 312. In some cases, the thickness of layer 502 is 10, 25, 50 or more percent thicker overlying proximal surface 308 and distal surface 310, relative to sidewall 312. Additionally or alternatively, a continuity of layer 502 can be less overlying sidewall 312, relative to a continuity of layer 502 formed over proximal surface 308 and distal surface 310. For example, layer 502 may include pinholes or islands of material overlying sidewall 312 and be continuous overlying proximal surface 308 and distal surface 310. The difference in continuity can be obtained by manipulating deposition process conditions and/or by selectively treating layer 502 over proximal surface 308 and distal surface 310, relative to sidewall 312—e.g., by using directed ion or radical bombardment. Further, a composition and/or density of layer 502 overlying sidewall 312 may be different relative to a composition and/or density of layer 502 formed over proximal surface 308 and distal surface 310. For example, a density of layer 502 may be lower overlying sidewall 312, relative to a density of layer 502 over proximal surface 308 and distal surface 310.

Second layer 502 can be or include, for example, a nitride, a carbide an oxycarbide, a carbonitride, or an oxycarbonitride such as silicon nitride, SiCN, SiC, SiOCN, SiN, TiN, aluminum oxide, aluminum nitride, AlCN, TiCN, or the like. In some cases, second layer is amorphous silicon or amorphous carbon. In some cases, second layer 502 comprises one or more of a semiconductor or metalloid, such as silicon; a post transition metal, such as aluminum; and a transition metal such as titanium; such as a nitride, carbide, oxycarbide, or carbon nitride of any of such materials.

Similar to step 104, step 106 can include a plasma-enhanced cyclical deposition (e.g., PEALD) process. In accordance with examples of the disclosure, at least one of the second precursor and the second reactant (e.g., a noble gas) are exposed to a plasma to form second excited species during step 106.

With reference to FIG. 2, a plasma-enhanced cyclical deposition process 204 to deposit second layer of material 502 can include providing a noble gas to the reaction chamber for a noble gas pulse 208, optionally providing a second reactant for a second reactant pulse 219, providing a second precursor to the reaction chamber for one or more second precursor pulses 220, 222, and providing plasma power for one or more second plasma power pulses 224, 226. A second layer of material deposition cycle 230 can include (optionally) second reactant pulse 219, second precursor pulse 220, and second plasma power pulse 224.

Depositing the second layer of material step 106 can include a second cyclical process that includes providing a second precursor and a second reactant (e.g., a noble gas) to a reaction chamber (e.g., the reaction chamber used during step 104). Exemplary second precursors include one or more of metalloid (e.g., silicon) and a metal, and can be or include any of the first precursors noted above. In some cases, the first precursor and the second precursor are or include the same (e.g., silicon) precursor. By way of particular example, the first and second precursor can be or comprise a silane, such as silane, disilane and/or trisilane. The second reactant can be or include, for example, a nitrogen-containing reactant, such as $N_2$, a combination of $N_2$ and $H_2$, $NH_3$, $N_2H_2$, and hydrazine derivatives, such as C1-C4 alkyl-substituted hydrazine derivatives, wherein each functional group substitute is independently selected, and $H_2$. Non-limiting example embodiments of an alkyl-hydrazine may comprise at least one of tertbutylhydrazine ($C_4H_9N_2H_3$), methylhydrazine ($CH_3NHNH_2$), and dimethylhydrazine (($CH_3)_2N_2NH_2$).

In accordance with examples of the disclosure, the second reactant is different than the first reactant. In some cases, a noble gas, such as helium and/or argon, can act as or be the second reactant. In such cases, the second reactant can be used to form a plasma and reactive species therefrom. The same reaction chamber or separate reaction chambers can be utilized for steps 104 and 106. In embodiments where different reaction chambers are utilized for steps 104 and 106, the substrate may be transferred from a first reaction chamber to a second reaction chamber without exposure to the ambient atmosphere. The semiconductor processing apparatus utilized for steps 104 and 106 may comprise a cluster tool which comprises two or more reaction chambers and which may further comprise a transfer chamber through which the substrate may be transported between the first reaction chamber and the second reaction chamber. In some embodiments, the environment within the transfer chamber is controlled, i.e., the temperature, pressure and ambient gas can be controlled, such that the substrate is not exposed to the ambient atmosphere. After step 106, the reaction chamber can be purged.

Flowrates for second reactant pulse 219, second precursor pulse 220, 222, and second power pulse 224, 226 can be the same or similar to those described above in connection with deposition process 202.

Figure 6:
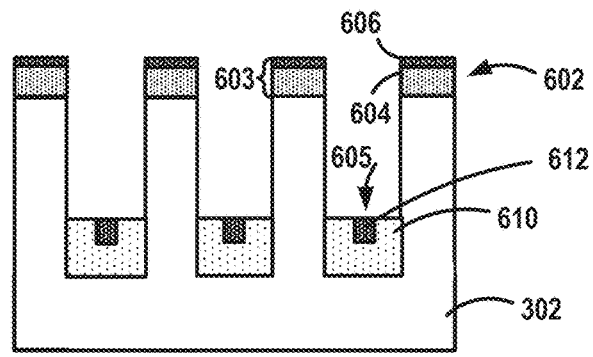

During step 108, the first layer of material is selectively etched or removed relative to the second layer of material to thereby form features 602 comprising topology-selective deposited material 603, 605 on the proximal and distal surfaces of patterned structures 304, as illustrated in FIG. 6. In this context, selectively etch means than an etch rate of the first layer of material is higher than an etch rate of the second layer of material—e.g., by 10, 25, 50, 75, 90 or more percent. The selective etching can be performed in the same reaction chamber used during step 104 and/or step 106 or another reaction chamber, such as another reaction chamber of the same cluster tool or using a wet etch process. At this stage, topology-selective deposited material 603 can include first material 604 from the first layer of material 402 and second material 606 from second layer of material 502 and topology-selective deposited material 605 can include first material 610 from the first layer of material 402 and second material 612 from second layer of material 502.

Any suitable selective etch process can be used during step 108. By way of examples, the etch can include providing a dry etchant, such as $NF_3$, HCl, TMAH, APM, HF or the like to form excited species (e.g., using a direct, indirect, and/or remote plasma) and exposing the substrate to the excited species. Additionally or alternatively, a wet etchant, such as an aqueous solution of tetramethylammoniumhydroxide (TMAH) or an ammonia and hydrogen peroxide mixture (APM) can be used to during step 108.

Figure 7:
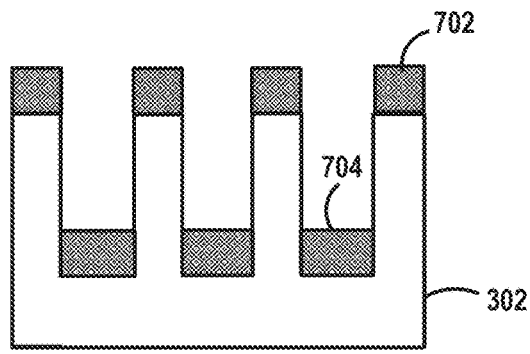

As illustrated in FIG. 1, method 100 can optionally include treatment step 110. Treatment step 110 can be used to, for example, oxidize, nitride, and/or carbonize material 604 and/or 606 to form structure 700, as illustrated in FIG. 7. For example, material 604 and/or 606 can be treated (e.g., oxidized, nitrided, and/or carbonized) to form material 702, 704. Treatment step 110 can include a plasma-enhanced process and can be performed in the same reaction chamber used during any of steps 104-108.

Structure 700 includes material 702 over proximal surface 308 and material 704 over distal surface 310, and substantially no or no material on sidewall 312. By way of examples, material 702, 704 can include silicon oxide, silicon nitride, SiCN, TiN, AlO, AlN, amorphous silicon, poly silicon, TiO, combinations thereof, and the like.

FIGS. 9-11 illustrate scanning electron transmission images of structures formed in accordance with examples of the disclosure. FIG. 9 illustrates a structure 900 that includes a first layer of material comprising silicon oxide 902 and a thin layer SiCN 904 (illustrated with a drawn line) selectively formed thereon. FIG. 10 illustrates the structure 1000 after exposure to an etch process (e.g., 200 second exposure to a 0.5% HF solution). FIG. 11 illustrates the structure 1100 after a etch process (e.g., 225 second exposure to a 0.5% HF solution). As illustrated in FIGS. 10 and 11, structures 1000 and 1100 include topo-selectively formed material 1002, 1004, 1102, and 1104, with little to no material remaining on sidewalls of structures 1000, 1100.

Further described herein is a semiconductor processing apparatus or system. The system comprises a reaction chamber. The reaction chamber comprises a substrate support that is arranged for supporting a substrate. The substrate comprises one or more gap features. The system further comprises a heater that is constructed and arranged to heat the substrate in the reaction chamber. The system further comprises a plasma module. The plasma module comprises a radio frequency power source that is constructed and arranged to generate a plasma in the reaction chamber. The system further comprises one or more material precursor sources, such as one or more silicon precursor sources, that are in fluid connection with the reaction chamber via one or more precursor valves. The system further comprises a controller. The controller is configured for causing the apparatus to perform a method as described herein.

Optionally, the system is configured for providing the material precursor to the reaction chamber by means of a carrier gas. Suitable carrier gases include noble gases. In other words, in some embodiments, the system comprises a gas injection system comprising a precursor delivery system that employs a carrier gas for carrying the material precursor to one or more reaction chambers.

Figure 8:
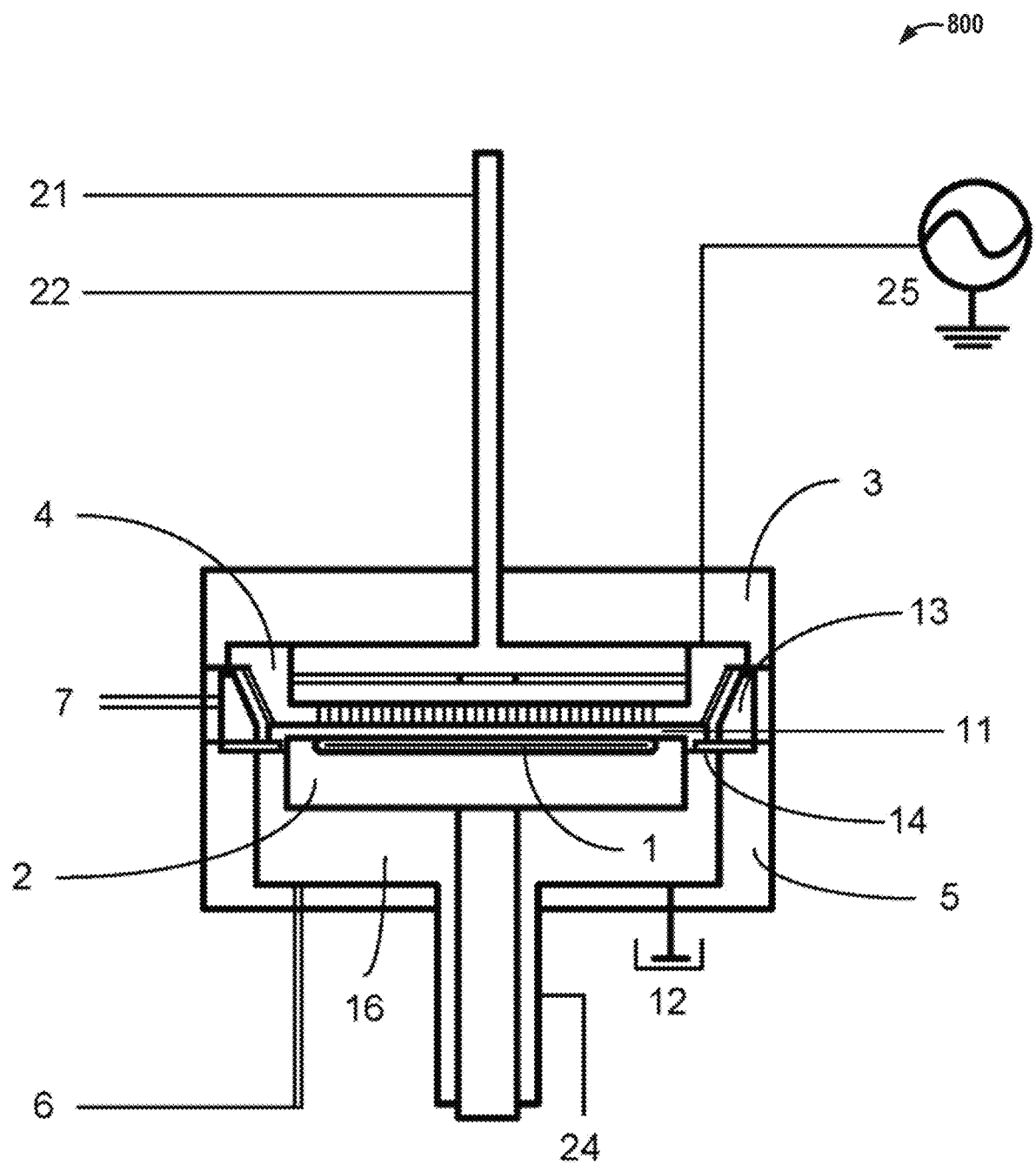
FIG. 8 illustrates a system in accordance with yet further examples of the disclosure.

The presently provided methods may be executed in any suitable apparatus, including in an embodiment of a system illustrated in FIG. 8, which is a schematic view of a plasma-enhanced atomic layer deposition (PEALD) apparatus 800, usable in embodiments of exemplary methods described herein. In this figure, by providing a pair of electrically conductive flat-plate electrodes 2,4 in parallel and facing each other in the interior 11 (reaction zone) of a reaction chamber 3, applying RF power (e.g., at 13.56 MHz and/or 27 MHz or between 100 KHz and 2 GHz) from a power source 25 to one side, and electrically grounding the other side 12, a plasma can be generated between the electrodes. Of course, and in some embodiments, system 800 can be configured for generating a plasma intermittently. For example, there may be no need for the semiconductor processing apparatus to generate a plasma during the steps when a precursor is provided to the reaction chamber, or during purges between subsequent processing steps, and no RF power need be applied to any one of the electrodes during those steps or purges. A temperature regulator may be provided in a lower stage 2, i.e., the lower electrode 2. A substrate 1 is placed thereon and its temperature can be set at a desired temperature or temperature range. The upper electrode 4 can serve as a shower plate as well, and various gases, such as a plasma gas, a reactant gas and/or a dilution gas, if any, as well as a precursor gas, can be introduced into the reaction chamber 3 through a first gas line 21 and a second gas line 22, respectively, and through the shower plate 4. Additionally, in the reaction chamber 3, a circular duct 13 with an exhaust line 7 is provided, through which the gas in the interior 11 of the reaction chamber 3 is exhausted. Additionally, a transfer chamber 5 is disposed below the reaction chamber 3 and is provided with a gas seal line 24 to introduce seal gas into the interior 11 of the reaction chamber 3 via the interior 16 of the transfer chamber 5, wherein a separation plate 14 for separating the reaction zone and the transfer zone is provided. Note that a gate valve through which a wafer may be transferred into or from the transfer chamber 5 is omitted from this figure. The transfer chamber is also provided with an exhaust line 6. In some embodiments, the deposition of the material and etch and/or treatment are performed in the same reaction space, so that all the steps can be conducted without any need for intermediate steps of evacuating reaction chambers, pumping down reaction chambers, or exposing the substrate to atmospheric air.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A topology-selective deposition method comprising the steps of:
    providing a substrate comprising patterned structures on a surface of the substrate, the patterned structures comprising a gap, the gap comprising a proximal surface, a distal surface, and a sidewall;
    depositing a first layer of material on the patterned structures, thereby conformally forming a first layer on the proximal surface, the distal surface, and the sidewall;
    depositing a second layer of material overlying the first layer of material, wherein the second layer of material is selectively formed on at least one of the proximal surface and the distal surface relative to the sidewall; and
    selectively etching the first layer of material relative to the second layer of material to thereby form features comprising topology-selective deposited material,
    wherein an etch rate of the first layer of material is 10 or more percent higher than an etch rate of the second layer of material,
    wherein after the step of selectively etching, at least a portion of the first layer of material remains on the proximal surface and the distal surface and substantially no or no first layer material remains on the sidewall, and
    wherein the first layer of material comprises a transition metal oxide, a post transition metal oxide, a transition metal nitride, a post transition metal nitride, amorphous silicon, polysilicon, or an organic layer.

2. The method of claim 1, wherein the steps of depositing the second layer and selectively etching are performed within a same reaction chamber.

3. The method of claim 2, wherein the step of depositing the first layer of material is performed within the same reaction chamber.

4. The method of claim 2, wherein the step of selectively etching comprises introducing one or more of $NF_3$, HCl, and HF to the same reaction chamber.

5. The method of claim 1, wherein the step of depositing the first layer of material comprises a first cyclical process comprising providing a first precursor to a reaction chamber, and wherein the step of depositing the second layer of material comprises a second cyclical process comprising providing the first precursor to the reaction chamber.

6. The method of claim 5, wherein the first cyclical process comprises providing a first reactant and/or excited species formed therefrom to the reaction chamber and the second cyclical process comprises providing a second reactant and/or excited species formed therefrom to the reaction chamber, wherein the second reactant is different than the first reactant.

7. The method of claim 1, wherein the first layer of material comprises a transition metal oxide, a post transition metal oxide, a transition metal nitride, or a post transition metal nitride.

8. The method of claim 1, wherein the first layer of material and the second layer of material comprise silicon, and wherein the second layer of material comprises a nitride, an oxycarbide, a carbonitride, an oxycarbonitride, or amorphous silicon.

9. The method of claim 1, wherein the first layer of material comprises an oxide or a nitride, and wherein the second layer of material comprises nitrogen.

10. The method of claim 1, wherein the topology-selective deposited material comprises the portion of the first layer of material and the portion of the second layer of material, the method further comprising a step of treating the topology-selective deposited material, wherein the step of treating comprises one or more of oxidizing, nitriding, and carbonizing the second layer of material.

11. The method of claim 1, wherein the second layer of material comprises SiCN.

12. The method of claim 1, wherein one or more of (1) a number of pinholes in the second layer is higher overlying the sidewall relative to a number of pinholes of the second layer overlying one or more of the proximal surface and the distal surface and (2) the second layer forms islands on the sidewall and a continuous layer overlying one or more of the proximal surface and the distal surface.

13. The method of claim 1, wherein an etch rate of the second layer of material overlying the sidewall is higher than an etch rate of the second layer of material overlying the proximal surface and/or the distal surface.

14. The method of claim 1,
    wherein the first layer of material is formed using a first plasma-enhanced ALD process, and wherein the second layer of material is formed using a second plasma-enhanced ALD process,
    wherein the first plasma-enhanced ALD process comprises:
        providing a first precursor for a first precursor pulse; and
        providing a first reactant for a first reactant pulse,
    wherein at least one of the first precursor and the first reactant are exposed to a plasma to form first excited species;
    wherein the second plasma-enhanced ALD process comprises:
        providing a second precursor for a second precursor pulse; and
        providing a second reactant for a second reactant pulse, and
    wherein at least one of the second precursor and the second reactant are exposed to a plasma to form second excited species.

15. The method of claim 14, wherein the first precursor comprises a silicon precursor, and wherein the first precursor and the second precursor comprise the same precursor.

16. The method of claim 14, wherein the first reactant comprises an oxygen reactant that comprises a gas selected from the list consisting of $O_2$, $O_3$, $H_2O$, and $H_2O_2$, and wherein the second reactant comprises at least one noble gas.

* * * * *